United States Patent [19]

Shaw

[11] 4,392,299
[45] Jul. 12, 1983

[54] METHOD OF MANUFACTURING LOW RESISTANCE GATES AND INTERCONNECTIONS

[75] Inventor: Joseph M. Shaw, Cranbury, N.J.
[73] Assignee: RCA Corporation, New York, N.Y.
[21] Appl. No.: 223,493
[22] Filed: Jan. 8, 1981
[51] Int. Cl.³ .......................................... H01L 21/285
[52] U.S. Cl. ...................................... 29/590; 148/174; 427/84; 427/91
[58] Field of Search ............. 29/569 R, 571, 589–591; 148/1.5, 174, 187; 427/84, 91; 357/67

[56] References Cited

U.S. PATENT DOCUMENTS

| | | | |
|---|---|---|---|
| 2,602,033 | 7/1952 | Lander | 427/252 |
| 2,671,739 | 3/1954 | Lander | 427/255.2 |
| 3,519,504 | 7/1970 | Cuomo | 148/187 |
| 3,617,824 | 11/1971 | Shinoda et al. | 148/187 X |
| 3,881,242 | 5/1975 | Nuttall et al. | 29/589 |
| 4,065,588 | 12/1977 | Arnold | 29/589 X |
| 4,149,307 | 4/1979 | Henderson | 148/187 X |
| 4,283,439 | 8/1981 | Higashinakagawa et al. | 427/94 X |

OTHER PUBLICATIONS

Lepselter, *Bell System Journal*, vol. XLV, No. 2, Feb. 1966, pp. 233–253.

*Primary Examiner*—G. Ozaki
*Attorney, Agent, or Firm*—Birgit E. Morris; Donald S. Cohen; Lawrence P. Benjamin

[57] ABSTRACT

A method of forming low resistance silicided gates or interconnects is described wherein a refractory metal and silicon is simultaneously co-deposited to form a composite layer which is thereafter heat treated in a non-oxidizing atmosphere to form the polycrystalline state of the silicide.

4 Claims, 1 Drawing Figure

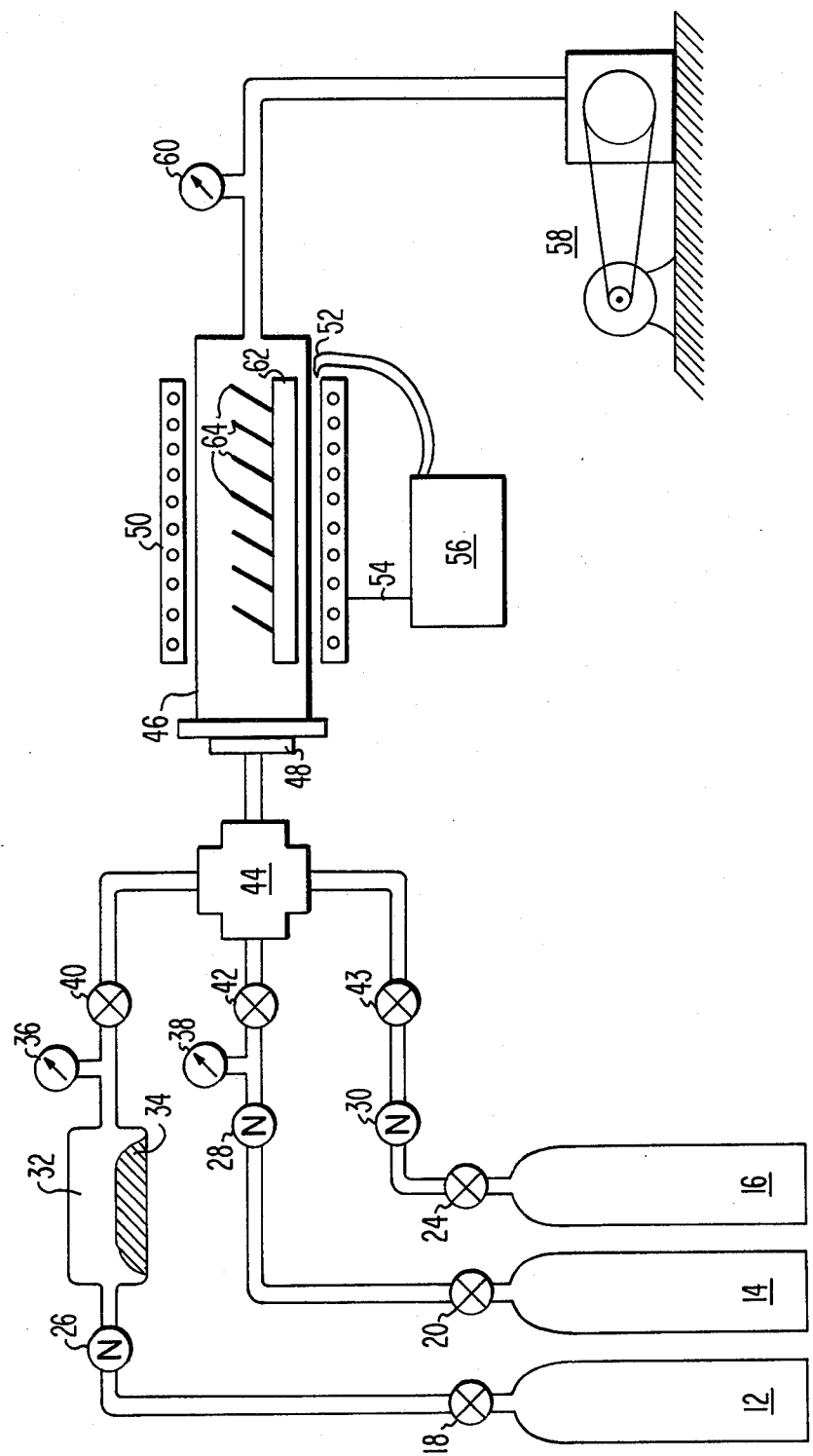

METHOD OF MANUFACTURING LOW RESISTANCE GATES AND INTERCONNECTIONS

BACKGROUND OF THE INVENTION

This invention relates, in general, to semiconductor devices and, more particularly, to a method of manufacturing refractory silicide gates and device interconnections having particular applicability in high speed integrated circuits.

In an article entitled "Beam-Lead Technology" by M. P. Lepselter which appeared in the Bell System Journal, Vol. XLV, No. 2, February 1966, there is described a process for fabricating beam-lead transistors where the leads form both the structural and electrical function. The contact and the subsequent formation of a lead consisting of sputtered titanium and platinum layers followed by a layer of electroformed gold is described. This represents an early attempt by the prior art to lower the resistance of the interconnecting leads. However, as the state of the integrated circuit art progressed, to achieve higher packing densities and reduced manufacturing costs, it became obvious that the process proposed in the above Lepselter article would be unacceptable since the leads occupied excessive areas of real estate and the added step of sputtering the titanium and platinum layers as well as electroforming the gold, raise the costs of the furnished device beyond acceptable limits.

An alternative to the use of elemental metallic leads of the early prior art, one current technique for producing lower resistance interconnecting leads, necessary in high density integrated circuits, involves the use of doped polysilicon interconnects. In addition, to achieve still higher packing densities, buried contacts have also found wide use. When used in NMOS technology, few difficulties are encountered using the doped polysilicon technique since both the polysilicon leads and the bulk silicon are doped with N-type impurities. However, when processing CMOS devices where it is necessary to have a lead interconnecting both a P channel and an N channel device, there are only relatively few techniques which will satisfactorily interconnect the devices without encountering the formation of an objectionable PN junction. One such method is described in Application No. 118,049, filed Feb. 4, 1980, by D. J. Tanguay, et al., entitled "BURIED CONTACT FOR COMPLEMENTARY MOS DEVICES" and assigned to the same assignee as the subject application, overcomes the difficulties of the prior art by utilizing a polysilicon line, doping the line with whatever type dopant conveniently suits the processing step, allowing the undesired junction to be formed and, thereafter, providing the junction with an electrical short circuit in the form of a polysilicided section which extends across and electrically short circuits the junction.

Still another prior art method utilized to overcome the prior art shortcomings is embodied in Application No. 127,046, filed Mar. 4, 1980, by C. E. Weitzel, et al., entitled "LOW SURFACE RESISTANCE MOSFET DEVICE AND METHOD OF MAKING SAME" and assigned to the same assignee as the subject application in which a portion of the surfaces of the drain and source regions, as well as a portion of the gate surface, is silicided in order to reduce the sheet resistance thereof. Thereafter, metallic ohmic contacts may be easily made to any of the portions of the now silicided areas.

As will be obvious to those skilled in the art, the common thread running through the prior art resides in the deposition of a refractory metal layer on a previously formed layer of silicon in order to produce, after treatment, a silicided region. The difficulties encountered with such a process come about when, for example, after treatment the user is left with either an excess of refractory metal or an excess of silicon. Thereafter, the excess refractory metal must be removed within a short period of time in order to prevent the formation of an undesirable oxide and in the case of excess silicon (insufficient refractory metal) one does not achieve the desired result. Accordingly, it becomes extremely difficult to achieve consistent results using the prior art methods.

SUMMARY OF THE INVENTION

In accordance with the teachings of the invention herein described, the prior art difficulties are overcome by co-depositing the refractory metal and the silicon to form a composite layer and thereafter, heat treating the composite to form a polycrystalline state of the silicide. By performing the method in accordance with my teachings, a stoichiometric reaction occurs thereby avoiding excess amounts of either of the reactants.

BRIEF DESCRIPTION OF THE DRAWING

The sole FIGURE in this case is a schematic representation of apparatus enabling one to carry out the invention.

DETAILED DESCRIPTION OF THE INVENTION

While the following exegesis will be presented in terms of using tungsten hexacarbonyl $W(CO)_6$, other similar compounds may be used provided the vapor pressure is relatively low.

Those skilled in the art would readily recognize that similar compounds of molybdenum may be used.

Referring now to the FIGURE in the drawing it will be seen that there is provided tank 12 having hydrogen gas under pressure, connected via appropriate piping to sublimator assembly 32 having an appropriate amount of, for example, tungsten carbonyl ($W(CO)_6$). The output of the sublimator assembly, namely, $W(CO)_6$ laden hydrogen, is fed into mixing chamber 44, the operation of which will be explained infra.

There is also shown tank 14 containing a diluted silane gas, under pressure, which is also piped to mixing chamber 44. Tank 16 is provided with a flushing gas, such as nitrogen, also piped to mixing chamber 44 in order to purge the system before use. The output of mixing chamber 44 is then fed into quartz furnace tube 46 which is heated by means of resistance elements 50 and eventually exhausted to the atmosphere by means of vacuum pump 58.

In order to accomplish the method, the system is first purged by means of nitrogen gas, under pressure, in tank 16. Cut off valves 24 and 43 are opened and nitrogen is fed through the system, in a needed amount regulated by needle valve 30. The pressure, as determined by the setting of needle valve 30, may be read at, for example, gauge 60. During the purging process, cut off valves 18, 40 and 20, 42 are closed to prevent the escape of any gases from tanks 12 and 14, respectively.

After the system is purged, the nitrogen flow is terminated by means of cut off valves 24 and 43. Initially, cut off valves 18 and 40 are opened and needle valve 26 adjusted to maintain a hydrogen pressure greater than about 1 millimeter (mm) of mercury as read on gauge 36. Since the $W(CO)_6$ 34 is a solid at room temperature and has a vapor pressure of approximately 0.1 mm at 20° C., the passage of the needed flow of hydrogen gas from tank 12 will transport gaseous $W(CO)_6$ into the system. Simultaneously with the introduction of the $W(CO)_6$ laden hydrogen gas, cut off valves 20 and 42 are also opened to introduce another gas, silane ($SiH_4$) either diluted with other gases or as high as 100% $SiH_4$ is metered into mixing chamber 44 by means of needle valve 28 to a pressure of about 5 mm as indicated on gauge 38. The $W(CO)_6$ laden hydrogen with sufficient silane may be mixed in any amounts and will still only produce the stoichiometric proportions required.

The mixed gases are then fed into quartz furnace tube 46 which has one end thereof capped with a vacuum tight cover 48 through which wafers are loaded. Wafers 64 traditionally are placed on a boat or holder 62 and inserted into quartz furnace tube 46 for the deposition processing. Quartz furnace tube 46 is heated by coils 50, the temperature of which is sensed by thermocouple 52 and regulated by means of lead 54 through an appropriate controller 56. During this time, vacuum pump 58 maintains the system under a vacuum.

A typical deposition may be done at a furnace temperature ranging between 500°-600° C. at a total system pressure of about 6 mm. Using about ½ percent silane in a hydrogen carrier gas metered to yield a pressure of about 5 mm and $W(CO)_6$ laden $H_2$ metered to yield a pressure of about 1 mm, I have found that a deposition time of about 4 minutes will yield a smooth, dark, metallic, composite film of approximately 5000 Angstroms thickness. At the completion of the deposition of the film it has been found that the as-deposited samples have a sheet resistivity of approximately 150–200 ohms/sq.

At this point in the processing of a semiconductor device using my novel method, it should now be obvious to those skilled in the art that the gates and interconnects of the device being formed may now be defined. This is done in a traditional manner wherein the coated wafer is provided with some appropriate masking material which is then subjected to, for example, a plasma etch to remove the unwanted materials. Thus, any radiation damage that may be introduced by reason of the plasma etch will be removed by the subsequent annealing or heat treating.

The coated wafers 64 are then heated in a non-oxidizing atmosphere such as helium, hydrogen or forming gas. Typically, I have found that by using a temperature of about 900° C.–1000° C., while maintaining the wafers in a hydrogen ambient for a period of about 30 minutes, the composite film or interconnect is converted to its highly conductive polycrystalline state of the form of $W_5Si_3$. I have found that a film processed in the manner described will have a typical sheet resistance of about 1–1.5 ohms/sq.

Further, by altering the deposition conditions to yield different ratios of the constituents of the film, it has been found that other forms of the silicide may also be obtained. Additionally, it should now be obvious to those skilled in the art that if the wafer has not previously had the gates and interconnects defined, that the defining steps may now be accomplished.

Thus, by utilizing the method described, one is able to avoid the prior art difficulties by producing a low resistance gate or interconnect composite which is not subject to the excesses of the individual components.

What I claim is:

1. A process for forming a low resistance refractory metal silicide on a substrate comprising the steps of:
   positioning the substrate in a reaction chamber maintained at a first temperature;
   depositing, in a single low pressure chemical vapor deposition step, a composite of a refractory metal and silicon on the substrate by simultaneously passing a gaseous mixture of both a refractory metal carbonyl and silane gas through the chamber and over the substrate; and
   heating the composite in a non-oxidizing atmosphere to a second temperature, higher than the first temperature, to form the silicide of the metal.

2. The process of claim 1, wherein:
   the refractory metal is derived from the metal carbonyl selected from the group consisting of molybdenum and tungsten; and
   the silicon is derived from a mixture of silane and a carrier gas.

3. The process of claim 2, wherein the step of depositing a composite of the refractory metal and silicon comprises:
   maintaining the gaseous mixture of the refractory metal carbonyl in a carrier gas at a pressure of about 1 mm;
   maintaining the silane gas at a pressure of about 5 mm, and
   the substrate and the gases are maintained at the first temperature which ranges from about 500° C. to about 600° C. for a period of about 5 minutes.

4. The process of claim 3, wherein the step of heating the composite to the second temperature comprises the steps of:
   annealing the composite at a temperature ranging from about 900° C. to about 1000° C. in a hydrogen atmosphere; and
   maintaining the composite at the annealing temperature, in the hydrogen atmosphere, for a period of about 30 minutes.

* * * * *